(12) United States Patent
Miyamoto et al.

(10) Patent No.: US 9,678,397 B2
(45) Date of Patent: Jun. 13, 2017

(54) DISPLAY DEVICE

(71) Applicant: Japan Display Inc., Minato-ku (JP)

(72) Inventors: Motoharu Miyamoto, Minato-ku (JP); Atsuhiro Katayama, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/237,011

(22) Filed: Aug. 15, 2016

(65) Prior Publication Data
US 2017/0090256 A1   Mar. 30, 2017

(30) Foreign Application Priority Data

Sep. 28, 2015 (JP) ................. 2015-189683

(51) Int. Cl.
*H01L 27/12* (2006.01)
*G02F 1/1362* (2006.01)
*G02F 1/1343* (2006.01)
*G02F 1/1368* (2006.01)
*G02F 1/133* (2006.01)
*G02F 1/1333* (2006.01)
*G02F 1/1337* (2006.01)
*G02F 1/1335* (2006.01)
*G02F 1/1339* (2006.01)

(52) U.S. Cl.
CPC ...... *G02F 1/136204* (2013.01); *G02F 1/1368* (2013.01); *G02F 1/13306* (2013.01); *G02F 1/133308* (2013.01); *G02F 1/133345* (2013.01); *G02F 1/134336* (2013.01); *G02F 1/134363* (2013.01); *G02F 1/136286* (2013.01); *H01L 27/124* (2013.01); *H01L 27/1222* (2013.01); *G02F 1/1339* (2013.01); *G02F 1/13378* (2013.01); *G02F 1/13439* (2013.01); *G02F 1/133512* (2013.01); *G02F 1/133514* (2013.01); *G02F 2001/133519* (2013.01); *G02F 2201/121* (2013.01); *G02F 2201/123* (2013.01); *G02F 2203/04* (2013.01)

(58) Field of Classification Search
CPC ...................... H01L 27/124; H01L 27/1222
See application file for complete search history.

(56) References Cited

U.S. PATENT DOCUMENTS

2013/0148049 A1   6/2013  Abe et al.

FOREIGN PATENT DOCUMENTS

JP          2013-83679          5/2013

*Primary Examiner* — Douglas Menz
(74) *Attorney, Agent, or Firm* — Oblon, McClelland, Maier & Neustadt, L.L.P.

(57) ABSTRACT

A liquid crystal display device includes a TFT substrate and a counter substrate with liquid crystal sandwiched therebetween. The TFT substrate has scanning lines 10 extending in a first direction and arrayed in a second direction and video signal lines 20 extending in the second direction and arrayed in the first direction. The TFT substrate has a display area 500 in which TFT pixels are arrayed in a matrix pattern, and a frame area 600 surrounding the display area. In the frame area 600, common bus wires 521 are formed in the same layer and with the same material as the video signal lines 20 and are impressed with a common voltage. Dummy TFTs are formed in a layer under the common bus wires 521. The scanning lines 10, extending over the frame area 600, are divided outside the display area and are interconnected by bridging wires 170.

16 Claims, 6 Drawing Sheets

DISPLAY DEVICE

CLAIM OF PRIORITY

The present application claims priority from Japanese Patent Application JP 2015-189683 filed on Sep. 28, 2015, the content of which is hereby incorporated by reference into this application.

BACKGROUND OF THE INVENTION

1. Field of the Invention

The present invention relates to a display device. More particularly, the invention relates to a liquid crystal display device that effectively prevents destruction of its wiring attributable to static electricity in the manufacturing process.

2. Description of the Related Art

The liquid crystal display device, which is one of various types of display devices, is made up of a thin-film transistor (TFT) substrate and a counter substrate with liquid crystal sandwiched therebetween, the TFT substrate having pixel electrodes and TFTs formed in a matrix pattern, the counter substrate being disposed opposite to the TFT substrate and having a black matrix or an overcoat film formed thereon. The liquid crystal display device has the light transmission factor of liquid crystal molecules controlled per pixel to form images.

On the TFT substrate of the liquid crystal display device, conductive films are stacked with insulating films sandwiched therebetween. If static electricity occurs during the manufacturing process of the liquid crystal display device, a large voltage can develop between a conductive film and ground. This may cause dielectric breakdown of an insulating film and disable the liquid crystal display device.

JP-A-2013-83679 describes a configuration in which dummy pixels are formed outside the display area with a view to preventing destruction of pixels due to static electricity inside the display area. If static electricity occurs, the dummy pixels are allowed to be destroyed to protect the pixels in the display area.

SUMMARY OF THE INVENTION

In the manufacturing process of a liquid crystal display device, insulating films and conductive films are stacked on top of one another. Following the formation of a conductive film, there may occur the phenomenon of a high voltage developing between the conductive film and ground, destroying an insulating film. In this case, the ground potential may be provided by manufacturing equipment on which the liquid crystal display panel is placed.

In the manufacturing process of a liquid crystal display panel, placing the panel on the manufacturing equipment causes a potential to occur due to static electricity between the panel and the mounting table of the equipment. Removing the liquid crystal display panel later from the mounting table reduces the capacitance between the mounting table and a conductive film formed on the panel. This raises the potential of the conductive film, destroying the insulating film in contact with the conductive film.

Making liquid crystal display panels one at a time is not an efficient option. Usually, numerous liquid crystal display panels are formed collectively on a single mother substrate and are later separated into the individual panels. The larger the size of the mother substrate, the larger the number of liquid crystal display panels manufactured at one time, which boosts productivity. In recent years, the mother substrate has come to measure 1,850 mm by 1,500 mm or thereabout in size for the manufacture of small-size liquid crystal display panels.

The larger the size of the mother substrate, the greater the amount of electric charge involved. This can lead to an even more serious problem of destruction caused by static electricity. It is therefore an object of the present invention to provide measures to prevent electrostatic breakdown, particularly during the manufacturing process.

In order to solve the above-described problem, specific means are provided typically as follows:

(1) According to an embodiment of the present invention, there is provided a liquid crystal display device including a TFT substrate and a counter substrate with liquid crystal sandwiched therebetween. The TFT substrate has scanning lines extending in a first direction and arrayed in a second direction and video signal lines extending in the second direction and arrayed in the first direction. The TFT substrate has a display area in which TFT pixels are arrayed in a matrix pattern, and a frame area surrounding the display area. In the frame area, common bus wires are formed in the same layer and with the same material as the video signal lines and are impressed with a common voltage. Dummy TFTs are formed in a layer under the common bus wires. The scanning lines extending over the frame area are divided outside the display area and are interconnected by bridging wires.

(2) Preferably in the display device described in paragraph (1) above, the bridging wires may extend in the second direction.

(3) Preferably in the display device described in paragraph (1) above, the bridging wires may be formed in the same layer and with the same material as the video signal lines.

(4) Preferably in the display device described in paragraph (1) above, the dummy TFTs may be formed at the same pitch as the TFTs formed in the display area.

(5) Preferably in the display device described in paragraph (1) above, the dummy TFTs constituting a semiconductor layer may not be connected to a conductive layer.

(6) Preferably in the display device described in paragraph (1) above, a common electrode formed of a transparent conductive film may be disposed over the common bus wires.

(7) Preferably in the display device described in paragraph (1) above, scanning line drive circuits may be disposed in the frame area in a manner arranged on both sides of the display area.

DESCRIPTION OF THE PREFERRED EMBODIMENTS

The present invention is described below in detail using some preferred embodiments.

First Embodiment

Figure 1:
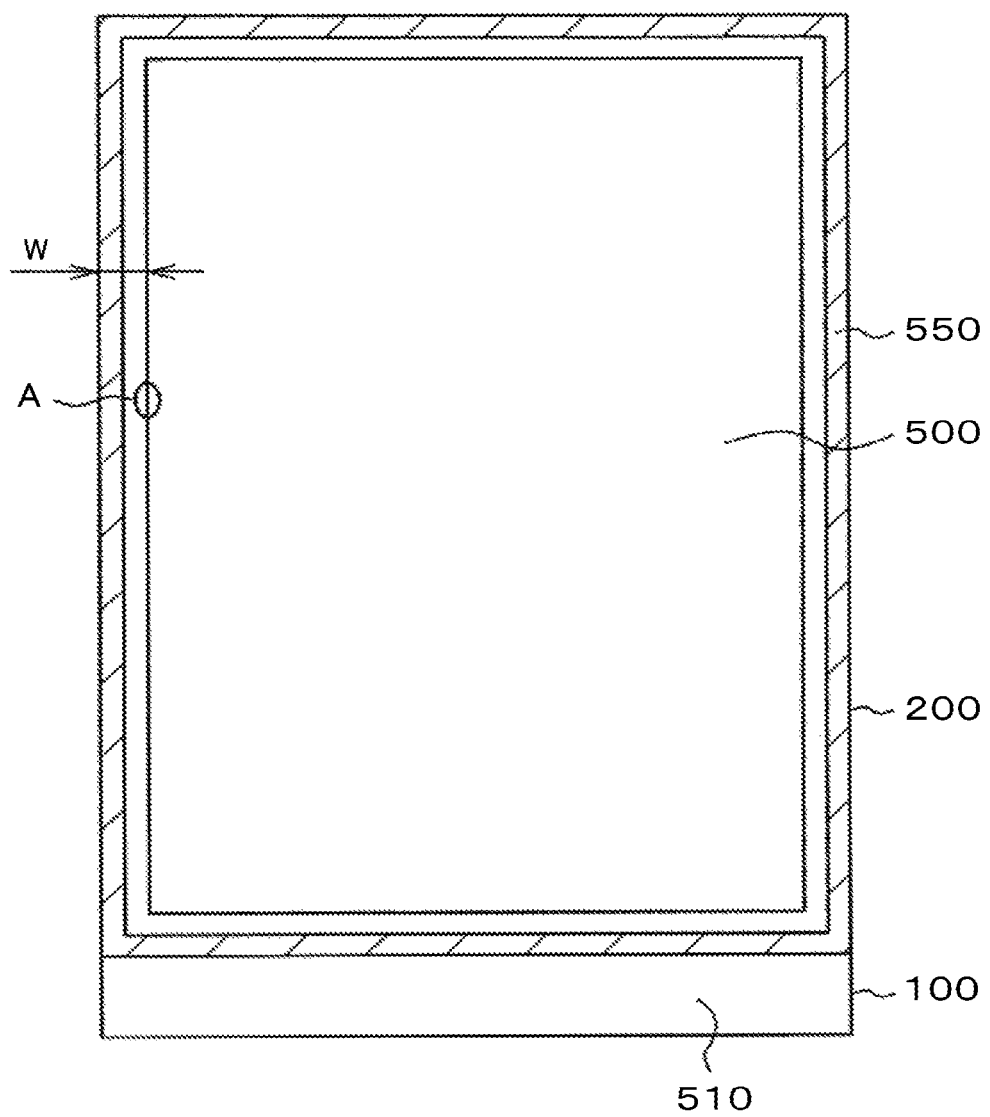
FIG. 1 is a plan view of a liquid crystal display panel.

FIG. 1 is a plan view of a liquid crystal display panel as an example of the liquid crystal display device according to the present invention, the panel being used typically on a mobile phone. In FIG. 1, a TFT substrate 100 is disposed opposite to a counter substrate 200 with liquid crystal sandwiched therebetween. The portion where the TFT substrate 100 and the counter substrate 200 overlap each other constitutes a display area 500. The portion surrounding the display area 500 makes up a frame area (peripheral area).

The frame area has a sealant 550 and lead wires formed therein, the sealant 550 bonding the TFT substrate 100 and the counter substrate 200 together, the lead wires providing connections to scanning lines or video signal lines. The frame area also has internal circuits formed therein such as scanning line drive circuits. In recent years, the width (w) of the frame area has come to be as narrow as about 0.4 mm to 0.5 mm, as shown in FIG. 1.

The TFT substrate 100 is made larger than the counter substrate 200. That portion of the TFT substrate 100 which is not overlaid with the counter substrate 200 constitutes a terminal area 510. The terminal area 510 has terminals that connect to a flexible wiring substrate for supplying signals and power to the liquid crystal display panel. The terminal area 510 is also connected with an IC driver that drives the liquid crystal display panel.

Figure 2:
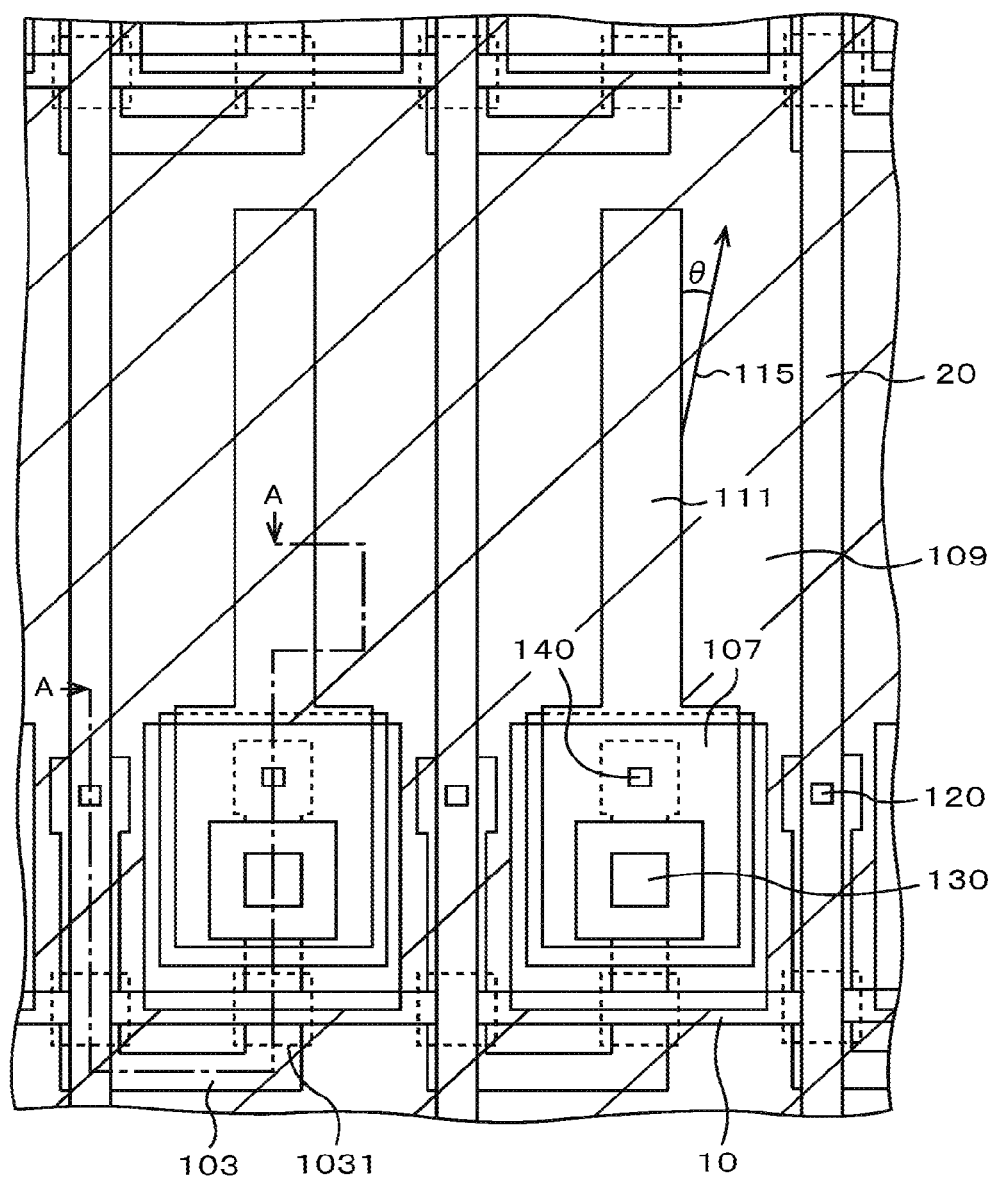
FIG. 2 is a plan view of pixels in a display area.

FIG. 2 is a plan view showing a pixel structure of an in-plane switching (IPS) system liquid crystal display device used in conjunction with the present invention. Of various versions of the IPS system, the most prevalent today is a system in which a common electrode is configured to be flat and covered by linear or stripe-shaped pixel electrodes with an insulating film interposed between the common electrode and the pixel electrodes, the system having liquid crystal molecules rotated by an electric field generated between the pixel electrodes and the common electrode with a relatively high transmission factor. This configuration will serve as a basis for the description that follows. Conversely, the present invention may be applied to a configuration in which the pixel electrodes are formed flat and covered by a common electrode having slits formed therein.

In FIG. 2, scanning lines 10 extend in a crosswise direction and are arrayed in a longitudinal direction at a predetermined pitch. The longitudinal pitch of the scanning lines 10 makes up the longitudinal size of each pixel. Also, video signal lines 20 extend in the longitudinal direction and are arrayed in the crosswise direction at a predetermined pitch. The crosswise pitch of the video signal lines 20 forms the crosswise size of each pixel.

In each pixel, a stripe-shaped pixel electrode 111 extends in the longitudinal direction. In FIG. 2, the crosswise size of one pixel (pixel pitch) is as small as 30 µm or less, so that the pixel electrode 111 is configured to be linear. Where the pixel pitch is larger, the pixel electrode 111 becomes a stripe-shaped electrode having a slit therein.

The pixel electrodes 111 are supplied with a video signal from the video signal lines 20 via TFTs. In FIG. 2, the video signal lines 20 and a semiconductor layer 103 are interconnected via through-holes 120. The semiconductor layer 103 extends under the video signal lines 20 and passes under the scanning lines 10, before being bent to again pass under the scanning lines 10 to connect with contact electrodes 107 via through-holes 140. The contact electrodes 107 connect to the pixel electrodes 111 via through-holes 130. The TFTs are formed when the semiconductor layer 103 passes under the scanning lines 10. In this case, each scanning line 10 doubles as a gate electrode. Thus in FIG. 2, two channel regions are formed from the video signal line 20 to the pixel electrode 111, constituting what is known as a double-gate TFT.

In FIG. 2, an alignment axis 115 of an alignment film forms an angle θ with respect to the extending direction of the pixel electrode 111. The reason the angle θ is formed here is because the rotating direction of liquid crystal molecules is determined when an electric field is impressed on the pixel electrodes 111. The angle θ ranges from about 5 to 15 degrees, preferably from 7 to 10 degrees. As an alternative, the direction of the alignment axis 115 may be taken as the longitudinal direction in FIG. 1, with the extending direction of the pixel electrode ill tilted by θ. The setup in FIG. 2 applies when the dielectric anisotropy of liquid crystal molecule is positive. The angle of the alignment axis 115 in effect when the dielectric anisotropy of liquid crystal molecules is negative is determined by having the alignment axis 115 in FIG. 2 rotated by 90 degrees. In FIG. 2, a common electrode 109 is formed all over the substrate except around the through-holes 130.

Figure 3:
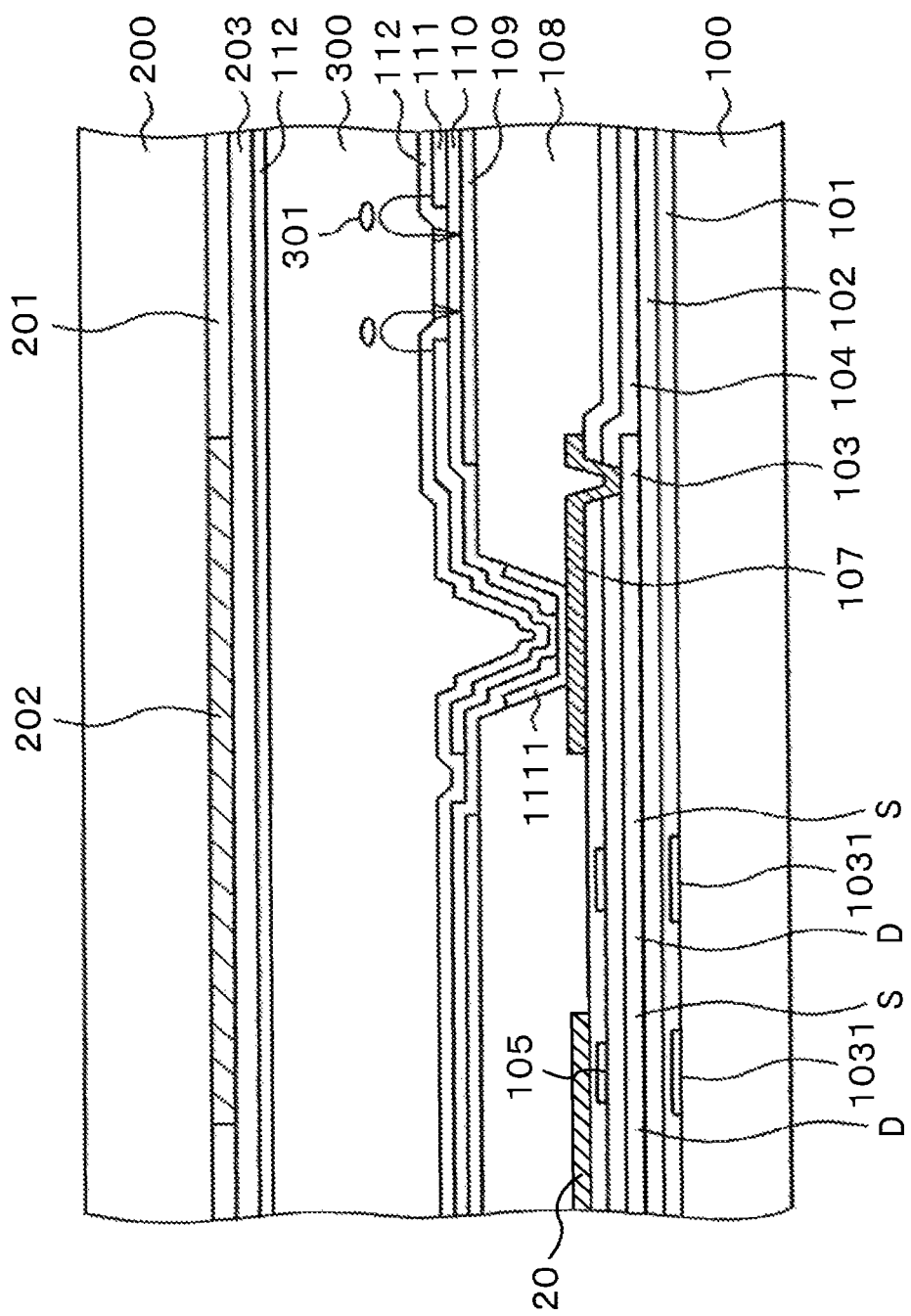
FIG. 3 is a cross-sectional view of a pixel in the display area.

FIG. 3 is a cross-sectional view taken on line A-A in FIG. 1. The TFT in FIG. 3 is what is known as the top-gate type TFT. Low temperature polysilicon (LTPS) is used as the semiconductor for this type of TFT. Where amorphous silicon (a-Si) is used as the semiconductor, the so-called bottom-gate type TFT is often employed. The ensuing description will be made on the assumption that the top-gate type TFT is in use. The present invention also applies where the bottom-gate type TFT is used.

In FIG. 3, a channel is shown formed where the semiconductor layer 103 passes under a scanning line 10, as will be explained later. In order to prevent leak currents at the channel due to photoconduction caused by light from the backlight, a channel light shielding film 1031 is provided at a portion corresponding to the channel, between the semiconductor layer 103 and the substrate 100. The channel light shielding film 1031 is typically produced by forming molybdenum tungsten (MoW), molybdenum chromium (Mo—Cr), titanium (Ti), or their alloys by sputtering, for example, before patterning what is thus formed.

Thereafter, over the substrate 100 and the channel light shielding film 1031, a first base film 101 made of silicon nitride (SiN) and a second base film 102 made of silicon dioxide ($SiO_2$) are formed by chemical vapor deposition (CVD). The first base film 101 and the second base film 102 play the role of protecting the semiconductor layer 103 against contamination by impurities from the glass substrate 100.

The semiconductor layer 103 is formed over the second base film 102. The semiconductor layer 103 is produced by forming an amorphous silicon (a-Si) film over the second base film 102 by CVD and by having the a-Si film laser-annealed for conversion into a polysilicon film. The polysilicon film is then patterned by photolithography.

A gate insulating film 104 is formed over the semiconductor film 103. The gate insulating film 104 is a silicon oxide ($SiO_2$) film based on tetraethoxysilane (TEOS). This film is also formed by CVD. Gate electrodes 105 are formed over the gate insulating film 104. The scanning lines 10 double as the gate electrodes 105. The gate electrodes 105 are formed using a MoW film, for example. If it is necessary to reduce the resistance of the gate electrodes 105 or of the scanning lines 10, an aluminum (Al) alloy may be used.

Thereafter, an interlayer insulating film 106 is formed using $SiO_2$ to cover the gate electrode 105. The interlayer insulating film 106 is intended to provide insulation between the gate electrode (gate wiring) 105 and the contact electrodes 107. The semiconductor layer 103 connects to the video signal lines 20 via the through-holes 120 formed in the gate insulating film 104 and the interlayer insulating film 106. In the interlayer insulating film 106 and the gate insulating film 104, through holes 140 are formed to connect the source region S of the semiconductor layer 103 with the contact electrodes 107. The through holes 120 and the through holes 140 are formed simultaneously in the interlayer insulating film 106 and in the gate insulating film 104.

The contact electrodes 107 are formed over the interlayer insulating film 106. Meanwhile, the semiconductor layer 103 extends under the video signal lines 20 before passing twice under the scanning lines 10, i.e., under the gate electrodes 105 as shown in FIG. 2. At this point, the TFTs are formed. That is, when viewed in a plan view, the source S and the drain D of each TFT are formed in a manner sandwiching the gate electrode 105. The contact electrodes 107 connect to the semiconductor layer 103 via the through-holes 140 formed in the interlayer insulating film 106 and the gate insulating film 104.

The contact electrodes 107 and the video signal lines 20 are formed simultaneously in the same layer. The contact electrodes 107 and the video signal lines 20 are produced using an aluminum silicon (AlSi) alloy, for example, to reduce their resistance. Since the AlSi alloy tends to develop hillocks or to let Al diffuse into other layers, the AlSi alloy is configured to be sandwiched by barrier and cap layers of MoW, for example.

An organic passivation film 108 is formed to cover the contact electrodes 107, video signal lines 20, and interlayer insulating film 106. The organic passivation film 108 is formed using photosensitive acrylic resin. Alternatively, the organic passivation film 108 may be formed using silicon resin, epoxy resin, or polyimide resin, for example, instead of the acrylic resin. The organic passivation film 108 is formed thick because it serves as a planarizing film. The thickness of the organic passivation film 108 ranges from about 1 to 4 μm, and often from 2 to 3 μm.

In order to provide conductivity between the pixel electrodes 111 and the contact electrodes 107, the organic passivation film 108 is formed along with the through holes 130 in a capacitance insulating film 110, to be discussed later. The organic passivation film 108 uses a photosensitive resin. The photosensitive resin is first applied and then exposed to light. Exposing the resin to light causes its exposed portions alone to dissolve in a specific developing solution. That is, using the photosensitive resin makes it possible to dispense with the formation of a photoresist. The formation of the through holes 130 in the organic passivation film 108 is followed by burning at about 230° C. This completes the organic passivation film 108.

Thereafter, indium tin oxide (ITO), which is a transparent conductive film later to become the common electrode 109, is formed by sputtering. Patterning is then performed to remove the ITO from the through holes 130 and from their surroundings. The common electrode 109 may be formed to be flat for common use with the pixels.

In FIG. 3, a connecting ITO 1111 is formed to cover the through-holes 130 at the same time that the common electrode 109 is formed. The ITO is intended to provide tolerance for the contact electrodes 107 and the pixel electrodes 111 coming into contact with one another. In this case, the connecting ITO 1111 needs to be insulated from the common electrode 109. Then SiN, which will later become the capacitance insulating film 110, is deposited all over the substrate by CVD. Then in the through holes 130, through-holes are formed in the capacitance insulating film 110 to provide conductivity between the contact electrodes 107 and the pixel electrodes 111.

Thereafter, the ITO is formed by sputtering and is patterned into the pixel electrodes 111. FIG. 2 shows a typical planar shape of the pixel electrodes 111. An alignment film material is applied onto the pixel electrodes 111 by flexographic printing or by ink jet printing, for example, before the burning process that forms an alignment film 112. The alignment processing of the alignment film 112 involves the rubbing method or photo-alignment using polarized ultraviolet light.

Impressing a voltage between the pixel electrodes 111 and the common electrode 109 generates electric lines of force as indicated by the arrows in FIG. 3. The electric field thus generated is used to rotate liquid crystal molecules 301 to control the amount of light passing through a liquid crystal layer 300 pixel by pixel, thereby forming an image.

In FIG. 3, the counter substrate 200 is disposed to sandwich the liquid crystal layer 300. Color filters 201 are formed inside the counter substrate 200. The color filters 201 include a red filter, a green filter, and a blue filter per pixel. These filters allow a color image to be formed. A black matrix 202 that enhances the contrast of the image is formed between the color filters 201. The black matrix 202 also serves as a light shielding film for the TFTs, preventing a photocurrent from flowing into the TFTs.

An overcoat film 203 is formed to cover the color filters 201 and the black matrix 202. The overcoat film 203 serves to flatten the uneven surface of the color filters 201 and black matrix 202. An alignment film 112 is formed over the overcoat film (under the film in FIG. 3) to determine the initial alignment of the liquid crystal. As with the alignment film 112 on the side of the TFT substrate 100, the alignment processing of the alignment film 112 involves the rubbing method or the photo-alignment method.

The above-described configuration is an example. Depending on the product type, there may be provided an inorganic passivation film formed of SiN, for example, between the TFT substrate 100 and the contact electrodes 107 or between the TFT substrate 100 and the video signal lines 20.

Figure 4:
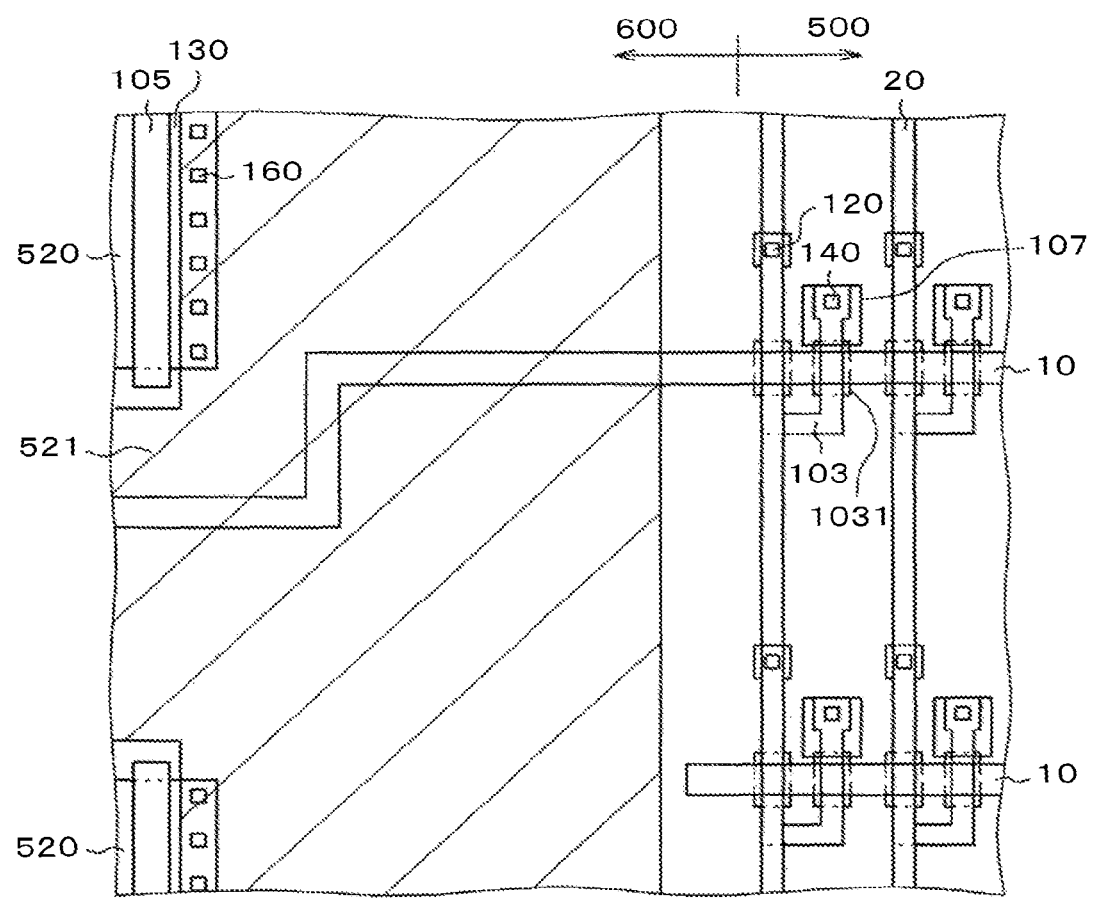
FIG. 4 is a detailed plan view of a boundary between the display area and the frame area in a setup to which the present invention is not applied.

FIG. 4 is a detailed plan view showing a boundary between the display area 500 and a frame area (non-display area) 600, the boundary corresponding to a region A in FIG. 1. FIG. 4 indicates a plane where the video signal lines 20 or the contact electrodes 107 are formed as shown in FIG. 3. That is, in the state of FIG. 4, the organic passivation film, common electrode, and pixel electrodes have yet to be formed.

In the display area 500 of FIG. 4, the semiconductor layer 103 corresponding to the pixels is provided in such a manner that the pixels are arrayed in the longitudinal and crosswise directions at a predetermined pitch each. In the frame area 600 in FIG. 4, peripheral circuits 520 such as scanning line drive circuits are formed. Also formed in the frame area 600 that has the peripheral circuits 520 are common bus wires 521 to which a common voltage is impressed. The common bus wires 521 are formed in the same layer as the video signal lines 20.

Shown in FIG. 4 as the typical peripheral circuit 520 is a large-size TFT which has a semiconductor layer 103, a gate electrode 105, and a through-hole 160 and of which one end is connected to a common bus wire 521.

During the manufacturing process that forms the above-described configuration, static electricity may generate sparks between the scanning lines 10 or gate electrodes 105 on the one hand and another layer on the other hand, destroying an insulating film between the layers. Such destruction due to static electricity can occur particularly in the pixels at the outermost peripheral part of the display area 500.

Sparks from static electricity are most often generated when the mother substrate is removed from the mounting table of the manufacturing equipment. The scanning lines, which are relatively long, are charged with large amounts of static electricity. Thus when the substrate is removed from the manufacturing equipment, the electric charge in the scanning lines presumably boosts their potential and thereby causes dielectric breakdown with another layer.

Figure 5:
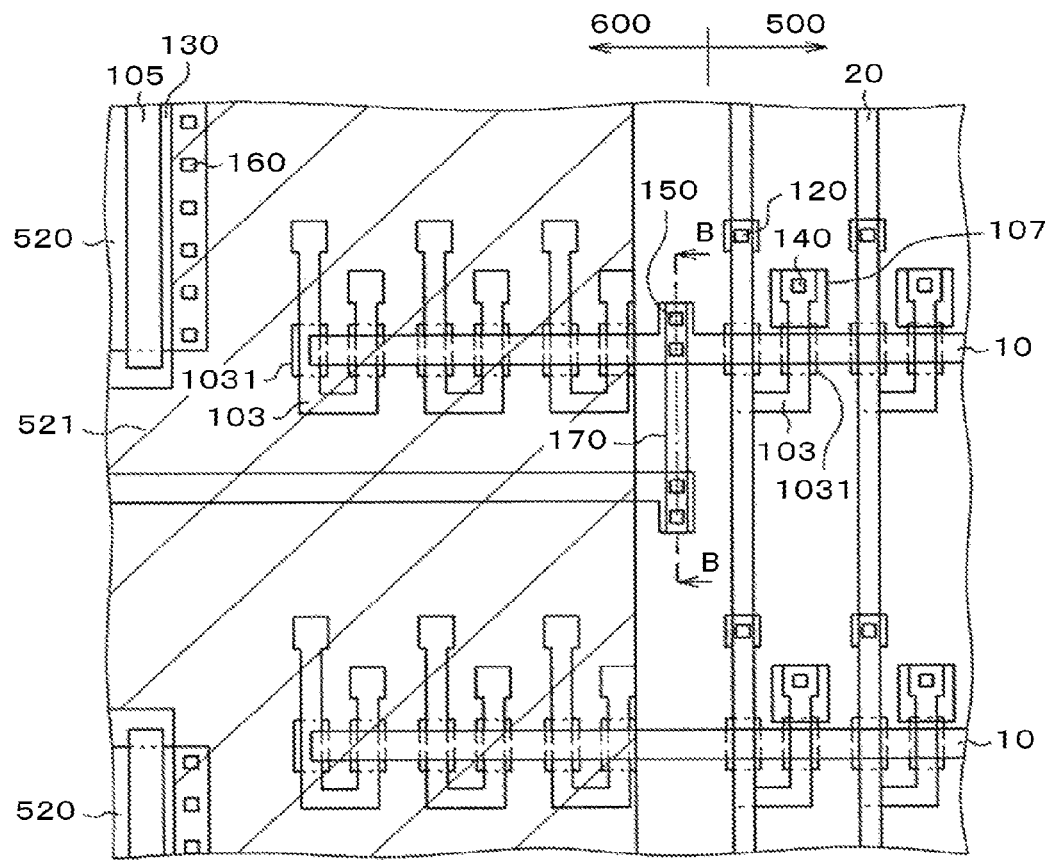
FIG. 5 is a detailed plan view of a boundary between the display area and the frame area in a setup according to the present invention.

FIG. 5 is a plan view showing how the present invention proposes to solve the above problem. The plan view of FIG. 5 also corresponds to the region A in FIG. 1. In the display area 500 in FIG. 5, the TFTs are arrayed in the longitudinal and crosswise directions at a predetermined pitch each and in a manner corresponding to the pixels. As in FIG. 4, the peripheral circuits 520 are formed in the frame area 600. And as in FIG. 4, the common bus wires 521 are formed in the same layer as the video signal lines 20, among others, in a manner covering the peripheral circuits 520, the common bus wires 521 being impressed with the common voltage.

What characterizes the configuration in FIG. 5 is that dummy TFTs are formed inside the frame area 600 in a layer under the common bus wires 521, the dummy TFTs being configured to be similar to the TFTs in the display area 500. It is preferred that the dummy TFTs be formed in the longitudinal and crosswise directions at the same pitch each as in the display area 500. While three columns of dummy TFTs are shown formed in FIG. 5, the number of dummy TFTs may be varied depending on the width of the frame area 600. As a minimum, one column of dummy TFTs may be provided.

The destruction of TFTs by static electricity concentrates on the pixels in the outermost peripheral part of the display area 500. For this reason, the dummy TFTs are formed outside of the pixels in the outermost peripheral part. The dummy TFTs are allowed to break in electrostatic breakdown, thereby protecting the pixels in the display area 500.

The semiconductor layer constituting the dummy TFTs in FIG. 5 is not connected to any other conductor. That is, the semiconductor layer making up the dummy TFTs in FIG. 5 is in an electrically floating state. If it is desired that the semiconductor layer composing the dummy TFTs be not in the electrically floating state, the semiconductor layer may be connected to the common bus wires 521 via through-holes.

What characterizes the configuration in FIG. 5 is that the scanning lines 10 are divided at the boundary between the display area 500 and the frame area 600 and are interconnected via through-holes 150 by bridging wires 170 formed in the same layer as the video signal lines 20. That is, sparks from static electricity occur before the video signal lines 20 are formed. The scanning lines 10 are long and charged with large amounts of electric charge, so that their potential, inordinately raised when the substrate is moved, can trigger sparks over the scanning lines 10. The present invention proposes to divide the scanning lines 10 to reduce the amount of electric charge therein, thereby preventing the destruction of the peripheral circuits caused by static electricity.

Figure 6:
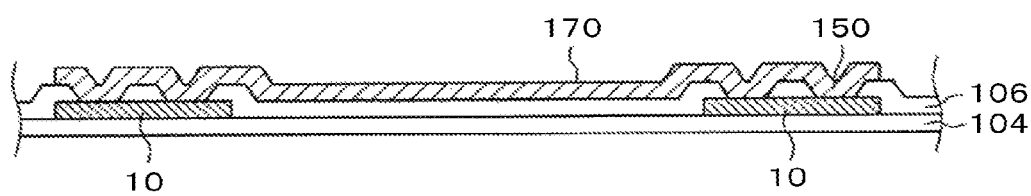
FIG. 6 is a cross-sectional view of a bridging part of scanning lines.

FIG. 6 is a cross-sectional view taken on line B-B in FIG. 5. This is a cross-sectional view of a bridging wire 170. In FIG. 6, the scanning lines 10 are shown interconnected by the bridging wires 170 via the through-holes 150 formed in the interlayer insulating film 106. This means that the scanning lines 10 are divided before being interconnected by the bridging wires 170. The amount of electric charge in each of the divided scanning lines 10 is reduced, so that the rise of their potential upon removal of the substrate from the manufacturing equipment is attenuated.

In FIG. 5, the bridging wires 170 are shown extending in the same direction as the video signal lines 20. The width of the frame area 600 is reduced by having the bridging wires 170 extending in the same direction as the video signal lines 20. Where the scanning lines 10 are divided as shown in FIG. 5, it is possible to prevent sparks stemming from the scanning lines 10 or from the gate electrodes 105 before the process in which the video signal lines 20 are formed. The frequency of sparks occurring after the video signal lines 20 have been formed is very low, which corroborates the high effectiveness of the present invention.

In FIG. 5, the way the scanning lines are wired is different between the upper and the lower rows of pixels. That is because the scanning line drive circuits of this embodiment are divided on the right and left of the display area. That is, the lower scanning line in FIG. 5 is supplied with a scanning signal from the scanning line drive circuit disposed on the right side of the display area in FIG. 1. The circuit arrangement is thus the same on the right and left of the display area.

FIG. 5 is a plan view in effect up until the state in which the video signal lines 20 are formed. After the video signal lines 20 have been formed, the organic passivation film 108, common electrode 109, capacitance insulating film 110, pixel electrodes 111, and alignment film 112, among others, are formed over the video signal lines 20 for example. In the finished product, over the wide common bus wires 521 in FIG. 5, the ITO-constituted common electrode 109 is formed with the organic passivation film 108 interposed therebetween.

Figure 7:
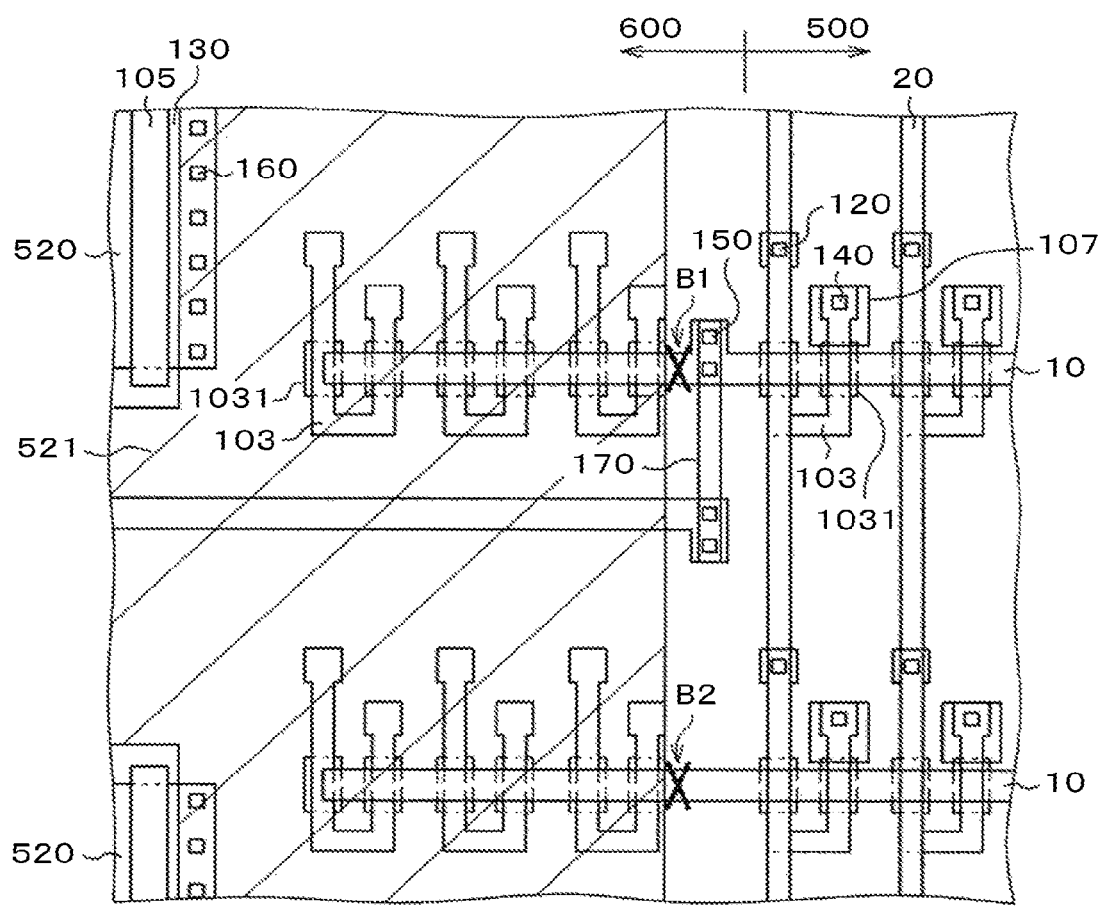
FIG. 7 is a detailed plan view of a boundary between the display area and the frame area in a setup that presents other features of the present invention.

Another characteristic of the present invention is that if dummy TFTs are destroyed by sparks, parts B1 and B2 of the scanning lines 10, indicated by cross (x) in FIG. 7, may be severed by laser, for example, to stave off subsequent adverse effects on the pixels in the display area. In this manner, the line defect failure of a specific scanning line can be prevented, which improves production yield.

The foregoing paragraphs have described the present invention using the IPS-system liquid crystal display device as an example. Alternatively, the invention can be applied to other types of liquid crystal display devices, including an organic electroluminescent (EL) display device that uses scanning lines. Further, whereas the above paragraphs have cited the ITO as the transparent conductive film, this is not limitative of the present invention. Argon zinc oxide (AZO) or indium zinc oxide, among others, may be used alternatively as the transparent conductive film.

What is claimed is:

1. A display device comprising a substrate that has scanning lines extending in a first direction and arrayed in a second direction and video signal lines arrayed in the first direction;
   wherein the substrate has a display area and a peripheral area outside the display area that has pixels arrayed in a matrix pattern, the pixels having thin-film transistors connected to the scanning lines;

a semiconductor layer is formed in the peripheral area;

the scanning lines are disposed over the semiconductor layer with an insulating film interposed therebetween; and the scanning lines are divided in the peripheral area and are interconnected by bridging wires between the semiconductor layer and the display area.

2. The display device according to claim 1, wherein the bridging wires extend in the second direction.

3. The display device according to claim 1, wherein in the peripheral area, wires are formed in the same layer as the video signal lines and are impressed with a predetermined voltage; and the semiconductor layer is disposed between the wires and the substrate.

4. The display device according to claim 2, wherein in the peripheral area, wires are formed in the same layer as the video signal lines and are impressed with a predetermined voltage; and the semiconductor layer is disposed between the wires and the substrate.

5. The display device according to claim 1, wherein the semiconductor layer is formed at the same pitch as the thin-film transistors formed in the display area.

6. The display device according to claim 2, wherein the semiconductor layer is formed at the same pitch as the thin-film transistors formed in the display area.

7. The display device according to claim 3, wherein the semiconductor layer is formed at the same pitch as the thin-film transistors formed in the display area.

8. The display device according to claim 1, wherein the semiconductor layer is not connected to a conductive layer.

9. The display device according to claim 2, wherein the semiconductor layer is not connected to a conductive layer.

10. The display device according to claim 3, wherein the semiconductor layer is not connected to a conductive layer.

11. The display device according to claim 1, wherein a transparent conductive film is disposed over the wires.

12. The display device according to claim 2, wherein a transparent conductive film is disposed over the wires.

13. The display device according to claim 3, wherein a transparent conductive film is disposed over the wires.

14. The display device according to claim 1, wherein scanning line drive circuits are disposed in the peripheral area in a manner arranged on both sides of the display area.

15. The display device according to claim 2, wherein scanning line drive circuits are disposed in the peripheral area in a manner arranged on both sides of the display area.

16. The display device according to claim 3, wherein scanning line drive circuits are disposed in the peripheral area in a manner arranged on both sides of the display area.

* * * * *